(12) United States Patent
Fujii

(10) Patent No.: US 7,241,660 B2
(45) Date of Patent: Jul. 10, 2007

(54) MANUFACTURING METHOD OF SEMICONDUCTOR DEVICE

(75) Inventor: Hidenori Fujii, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 233 days.

(21) Appl. No.: 11/092,554

(22) Filed: Mar. 29, 2005

(65) Prior Publication Data

US 2006/0046385 A1 Mar. 2, 2006

(30) Foreign Application Priority Data

Aug. 30, 2004 (JP) ............................. 2004-249515

(51) Int. Cl.
*H01L 21/336* (2006.01)
(52) U.S. Cl. ..................................... 438/257; 438/377
(58) Field of Classification Search ................ 438/257, 438/377, 378, 551, 669, 531
See application file for complete search history.

(56) References Cited

U.S. PATENT DOCUMENTS 6,246,102 B1 * 6/2001 Sauerbrey et al. .......... 257/529

2003/0207521 A1 * 11/2003 Tanaka et al. .............. 438/200

FOREIGN PATENT DOCUMENTS

| JP | 57-066675 | 4/1982 |
| JP | 2-139967 | 5/1990 |
| JP | 6-053444 | 2/1994 |

* cited by examiner

*Primary Examiner*—Andy Huynh
*Assistant Examiner*—Thinh T Nguyen
(74) *Attorney, Agent, or Firm*—Buchanan Ingersoll & Rooney PC

(57) ABSTRACT

A manufacturing method of a semiconductor device having a semiconductor memory including a plurality of nonvolatile memory elements, comprising a step of forming a mask on the semiconductor memory and a step of irradiating through the mask with electron beams, the mask having transmission parts on one or more nonvolatile memory elements selected from the plurality of nonvolatile memory elements and a blocking part in which the electron beam is blocked, thereby said one or more nonvolatile memory elements are irradiated with electron beams without requiring an additional process.

2 Claims, 6 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and more particularly, it relates to a manufacturing method of a semiconductor device comprising a semiconductor memory in which data is recorded.

2. Description of the Background Art

In order to add a nonvolatile memory such as an EPROM, a flash memory, an EEPROM to a normal CMOS process, it is necessary to add 5 to 10 masks and add additional processes such as CVD, diffusion, ion implantation and photo lithography in general. In addition, although a channel-cut ROM can be easily made, it cannot be deleted. Japanese Unexamined Patent Publication No. 57-66675 discloses a method of accumulating positive charges in a gate oxide film by electron beam drawing at a low voltage without a mask and accumulating negative charges in a gate electrode by electron beam drawing at low voltage in which enhancement type of NMOS is changed to depression type.

As described above, when the nonvolatile memory is mounted on the IC process, since the number of processes is increased, there is a problem such that a cost is increased and a structure becomes complicated so that a yield is lowered. In addition, according to the channel-cut ROM, since deleting and rewriting cannot be performed and a recording operation is necessary in the middle of the process, it is difficult to expand product variation. Furthermore, it takes time to record one bit because a beam current is not provided in the electron beam drawing at a low acceleration energy (several tens of keV), and a required time is increased by the number of bits every time the number of bits to be recorded is increased. Thus, there is a problem such that since the electron beam cannot be controlled when the drawing is performed at high acceleration energy and high current, the recording cannot be performed by one bit a time.

SUMMARY OF THE INVENTION

Thus, it is an object of the present invention to provide a manufacturing method of a semiconductor device in which recording can be performed in a semiconductor memory with electron beam irradiation without requiring an additional process.

In order to attain the above object, the manufacturing method of the semiconductor device provided with a semiconductor memory having a plurality of nonvolatile memory elements according to the present invention includes a step of forming a mask on the semiconductor memory and a step of irradiating through said mask with electron beams. The manufacturing method characterized in that the mask has transmission parts on one or more nonvolatile memory elements selected from said plurality of nonvolatile memory elements and a blocking part in which the electron beam is blocked so that the one or more nonvolatile memory elements are irradiated with electron beams.

According to the present invention as described above, there can be provide the manufacturing method of the semiconductor device in which recording can be performed in the semiconductor memory with the electron beams requiring almost no additional process.

DETAILED DESCRIPTION OF THE PREFERRED EMBODIMENTS

Hereinafter, a semiconductor memory recording method according to an embodiment of the present invention will be described with reference to the drawings.

The semiconductor memory recording method according to the present invention is a method of recording data in a semiconductor memory in a manufacturing process of a semiconductor integrated circuit in which a high-voltage power element and a semiconductor memory are integrated on a semiconductor substrate, and it is characterized as will be described below.

First, a mask in which electron beams are applied only to predetermined nonvolatile memory elements is formed in a memory region comprising a plurality of nonvolatile memory elements, and the entire memory region is irradiated with the electron beams which are accelerated at relatively high speed so that a necessary nonvolatile memory element is irradiated with the electron beam simultaneously. Here, the nonvolatile memory element in this specification is a minimum unit memory element shown in FIG. 3, for example.

Secondly, recording is performed in the semiconductor memory using electron beams which are used to control a lifetime of a carrier in the high-voltage power element.

In addition, the high-voltage power element in the semiconductor integrated circuit according to this embodiment is a MOS field effect transistor (MOS-FET), an insulated gate bipolar transistor (IGBT), a diode or the like. The semiconductor integrated circuit in which these high-voltage power elements, a CMOS logic and a semiconductor memory are integrated is used in controlling a motor.

Hereinafter, a description will be made of the semiconductor integrated circuit and the semiconductor memory recording method according to this embodiment in detail.

Figure 1:
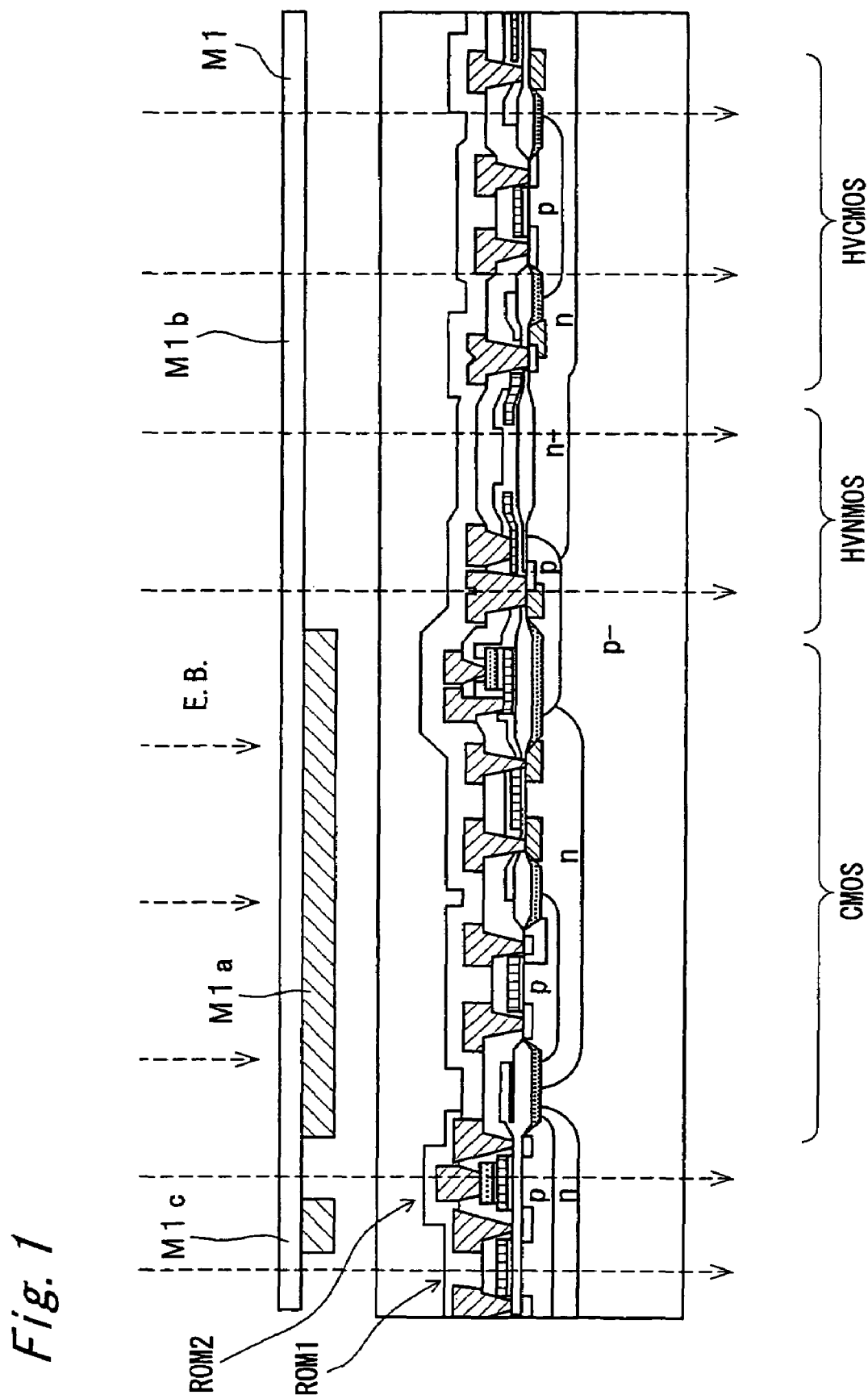
FIG. 1 is a sectional view showing a constitution of a semiconductor integrated circuit according to an embodiment of the present invention.

FIG. 1 is a sectional view showing an example of a constitution of a semiconductor integrated circuit according to this embodiment. A memory region comprising a high-voltage NMOS region (HVNMOS), a high-voltage CMOS region (HVCMOS), a CMOS region, and a lot of nonvolatile memory elements (to which ROM1 and ROM2 are allotted in FIG. 1) is integrally constituted on a P-Si substrate.

Figure 2:
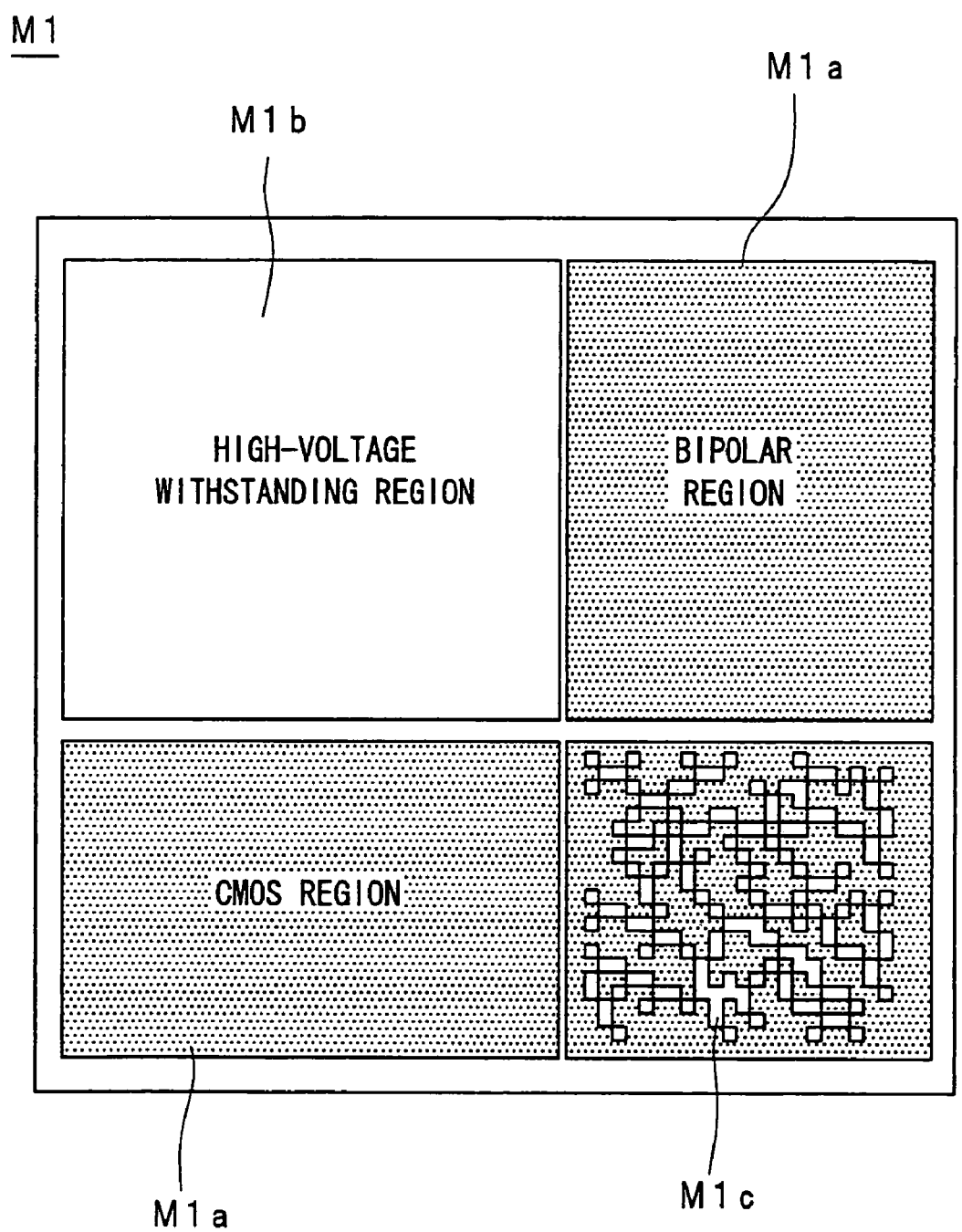
FIG. 2 is a plan view showing a mask used in a manufacturing method of the semiconductor integrated circuit according to the embodiment of the present invention.

According to this embodiment, in the last process of the semiconductor integrated circuit constituted as described above, electron beams are applied through a mask M1 as shown in FIG. 1 to adjust the lifetimes of the high-voltage NMOS region and the high-voltage CMOS region (HVCMOS) and to record data in the memory region at the same time. In the mask M1, a transmission region M1b which transmits the electron beam is provided at a part opposed to the high-voltage regions comprising the high-voltage NMOS region and the high-voltage CMOS region, and a blocking region M1a which does not transmit the electron beam is provided at a part opposed to the CMOS region and the bipolar region (refer to FIG. 2). In addition, in the mask M1, a selective transmission region M1c is provided at a part opposed to the memory region (refer to FIG. 2).

In the selective transmission region M1c, a pattern comprising a transmission part and a blocking part is formed so that only a predetermined part of the nonvolatile memory element is irradiated with the electron beam (refer to FIG. 2), and the necessary nonvolatile memory element is collectively irradiated with the electron beams through the mask M1.

According to this embodiment, since the data is simultaneously recorded in the memory region using the selective transmission region M1c of the mask M1, it is not necessary to limit a beam irradiation region to a narrow range like a conventional electron beam drawing, so that electron beams having high energy and high current (several hundred keV and several mA) can be used.

Thus, the lifetime control of the high-voltage power element and recording of data in the memory region can be performed at the same time.

Therefore, according to this embodiment, when the lifetime control of the high-voltage power element and the data recording in the memory region are performed at the same time, intensity and irradiation time of the electron beam may be set at a condition suitable for a desired lifetime control.

Next, a description will be made of a constitution example of a nonvolatile memory element constituted in the memory region and a recording and deleting method according to this embodiment.

Figure 3A:
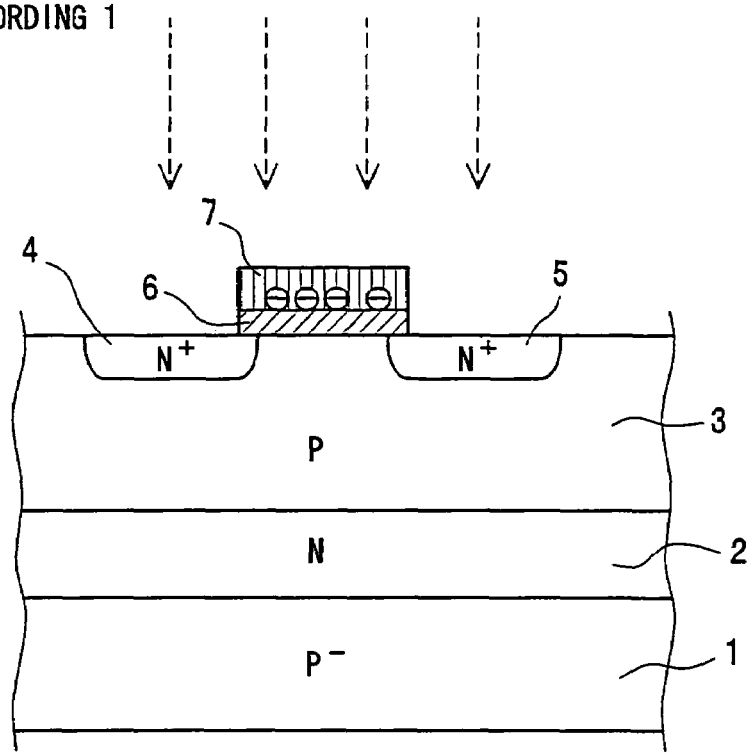
FIG. 3A is a sectional view showing a recording state in a nonvolatile memory element (an example of N-type ROM) which can be applied to the semiconductor integrated circuit according to the embodiment of the present invention.
Figure 3B:
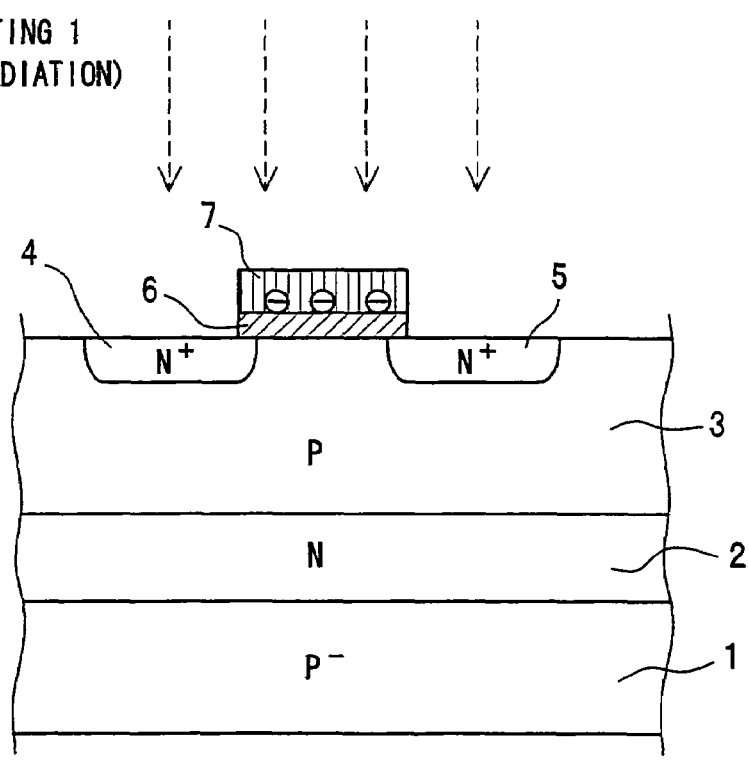
FIG. 3B is a sectional view showing a deleting state of the nonvolatile memory element shown in FIG. 3A.

FIGS. 3A and 3B show examples of nonvolatile memory elements having the same structure as that of the NMOS. In each of FIG. 3A and FIG. 3B, an N-type well region 2 and a P-type well region 3 are formed on a P-type substrate 1, and a source region 4 and a drain region 5 which are N+ regions are formed at the edges of a gate oxide film 6 and a gate electrode 7 on the surface. Here, the gate oxide film 6 is formed of SiO₂, for example, and the gate electrode 7 is formed of polysilicon, for example.

Figure 4A:
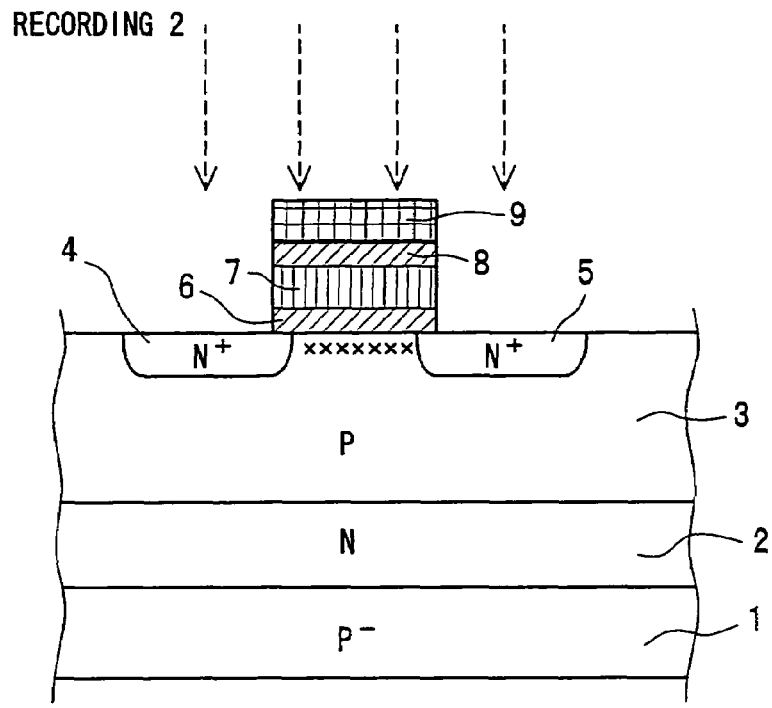
FIG. 4A is a sectional view showing a recording state in a nonvolatile memory element (another example of N-type ROM) which can be applied to the semiconductor integrated circuit according to the embodiment of the present invention.
Figure 4B:
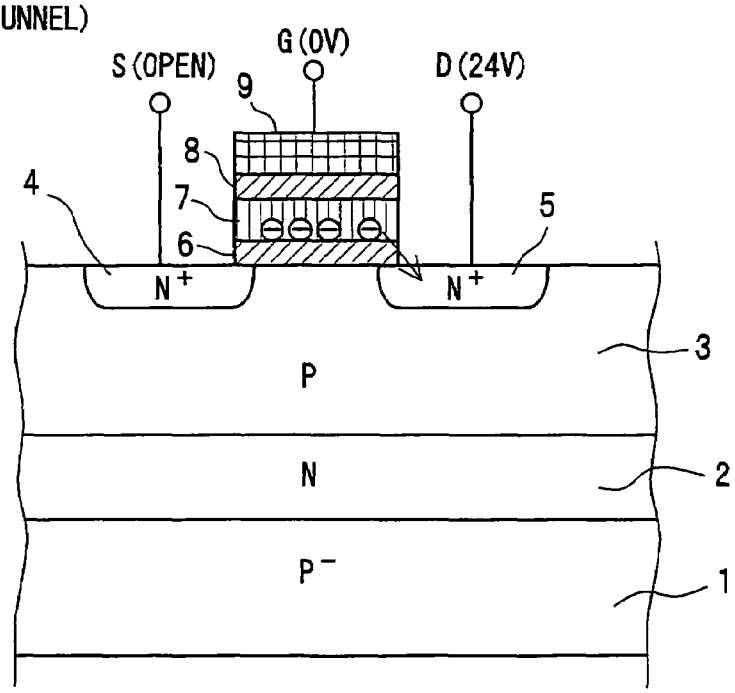
FIG. 4B is a sectional view showing a deleting state of the nonvolatile memory element shown in FIG. 4A.

FIGS. 4A and 4B show structures of nonvolatile memory elements. In each of FIG. 4A and FIG. 4B, an insulation film 8 formed of SiN, for example and a polysilicon film 9 are further formed in the nonvolatile memory element shown in each of FIGS. 3A and 3B, and the polysilicon film 9 serves as a control gate.

Figure 5A:
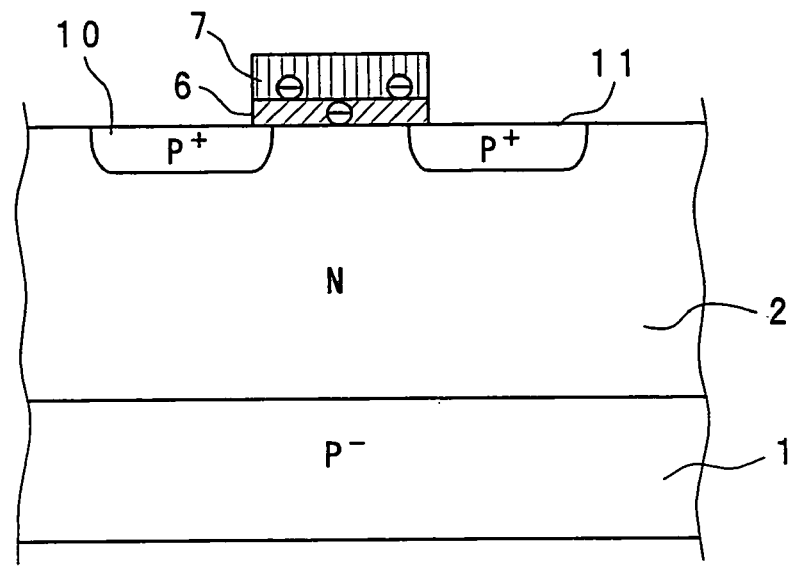
FIG. 5A is a sectional view showing a nonvolatile memory element (an example of P-type ROM) which can be applied to the semiconductor integrated circuit according to the embodiment of the present invention.

FIG. 5A shows an example of a nonvolatile memory element in which N-type well region 2 is formed on a P-type substrate 1 and a P-type source region 10 and a P-type drain region 11 are formed at edges of a gate oxide film 6 and a gate electrode 7 on the surface.

Figure 5B:
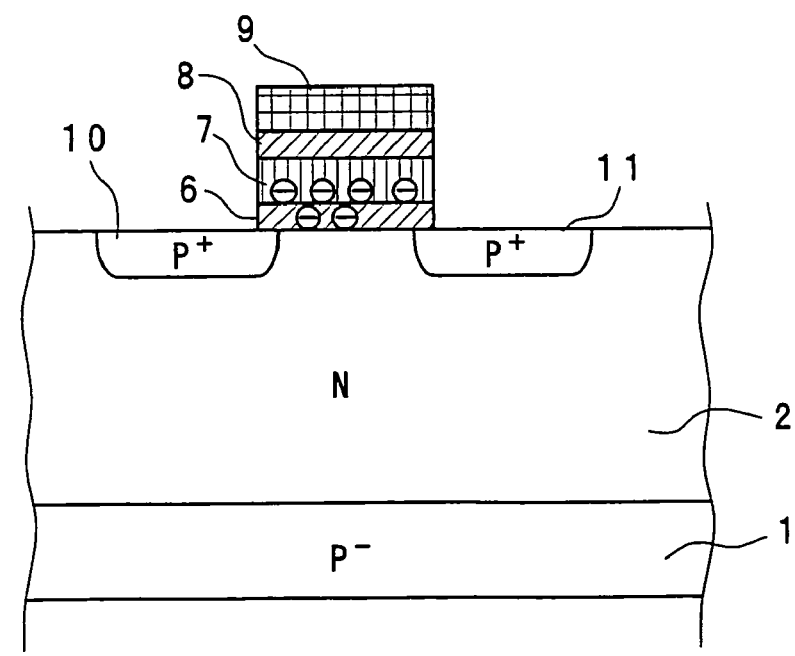
FIG. 5B is a sectional view showing a nonvolatile memory element (another example of P-type ROM) which can be applied to the semiconductor integrated circuit according to the embodiment of the present invention.

FIG. 5B shows a nonvolatile memory element in which an insulation film 8 and a polysilicon film 9 are further formed in the nonvolatile memory element shown in FIG. 5A and the polysilicon film 9 serves as a control gate.

When the nonvolatile memory element shown in FIG. 3A and the nonvolatile memory element shown in FIG. 4A which are N-type ROM constituted as described above are irradiated with electron beams at high acceleration energy and high current (several hundred keV and several mA), electrons are charged in the gate electrode 7 and a threshold voltage Vth is shifted to plus side.

Figure 6:
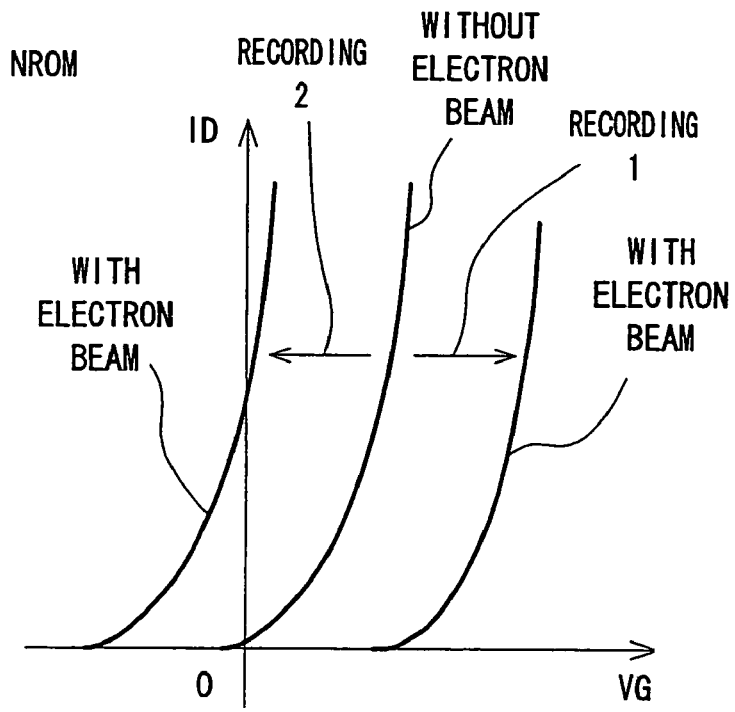
FIG. 6 is a graph showing variation of characteristics in the N-type ROM according to presence or absence of electron beam irradiation.

A current to the gate voltage VG at this time is as shown in FIG. 6. That is, the current is changed in the direction shown by an arrow designated by a recording 1 in the nonvolatile memory element shown in FIG. 3A and the current is changed in the direction shown by an arrow designated by a recording 2 in the nonvolatile memory element shown in FIG. 4A before and after the electron beam irradiations (EB).

In addition, a threshold voltage Vth is shifted to the minus side in the nonvolatile memory element shown in FIG. 5A and in the nonvolatile memory element shown in FIG. 5B which are the P-type ROM.

Figure 7:
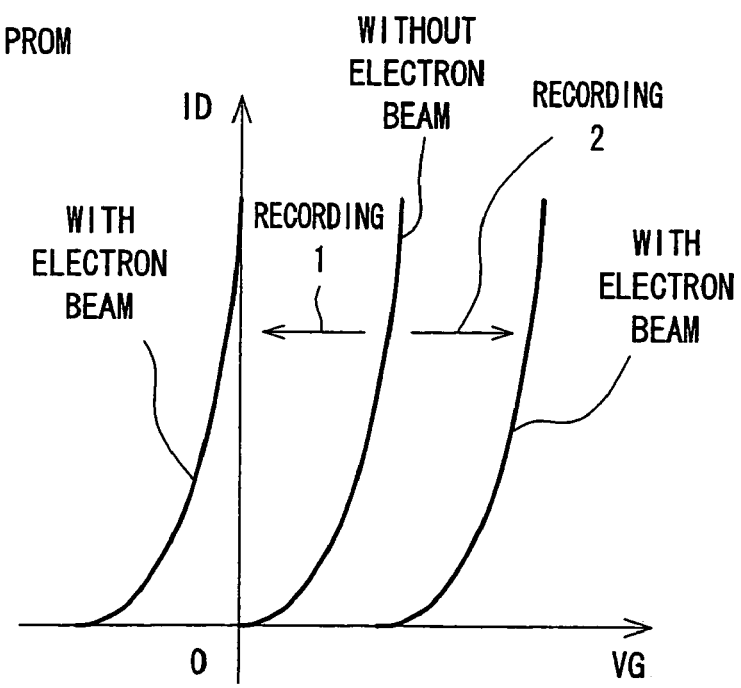
FIG. 7 is a graph showing variation of characteristics in the P-type ROM according to presence or absence of electron beam irradiation.

A current to the gate voltage VG at this time is as shown in FIG. 7. That is, the current is changed in the direction shown by an arrow designated by a recording 1 in the nonvolatile memory element shown in FIG. 5A and the current is changed in the direction shown by an arrow designated by a recording 2 in the nonvolatile memory element shown in FIG. 5B before and after the electron beam irradiations (EB).

Therefore, data can be recorded by constituting the memory region using these nonvolatile memory elements and selectively irradiating a predetermined nonvolatile memory element with electron beams.

In addition, after the irradiation with the electron beams, it is preferable that annealing is performed at relatively low temperature such as 200 to 300° C. for several tens of minutes in order to recover a damage by the electron beams.

The recorded data can be deleted by irradiating the entire surface with ultraviolet ray to erase the charged electrons (FIG. 3B) or drawing out the electrons by an FN tunnel current (FIG. 4B).

According to this embodiment, when the deleting is performed and the recording is performed again also, the mask is provided again similarly, so that a program in the memory region can be arbitrarily rewritten by electron beam irradiation. However, at the time of rerecording, patterning has to be performed so that only a necessary part in the memory region is irradiated with the electron beams so as not to change the lifetime of the high-voltage power element part.

Furthermore, since the heat treatment after the recording again is performed only for a short time to recover the damage of the surface of the memory region, an influence on other elements can be considerably small and the deleting and rerecording processes can be repeated.

According to the semiconductor memory recording method of this embodiment of the present invention as described above, since only the high-voltage power element and the predetermined nonvolatile memory element in a memory part are irradiated with the electron beams, the control of the lifetime of the high-voltage power element and the recording in the memory part can be performed at the same time.

In addition, according to the present invention, since the CMOS and the bipolar element part are shielded by the mask so as not to be irradiated with the electron beams, the characteristics can be prevented from deteriorating.

More specifically,

1. The nonvolatile memory can be mounted on the semiconductor integrated circuit with almost no additional process, 2. Recording can be performed in the nonvolatile memory in which deleting and rerecording can be performed at the final step of the process, and 3. A large amount of processing can be performed by employing the recording method by the electron beam irradiation and the deleting method by the UV irradiation because those steps are both batch processing.

Therefore, according to the present invention, the semiconductor integrated circuit comprising the nonvolatile memory can be manufactured at low cost.

What is claimed is:

1. A manufacturing method of a semiconductor device having a semiconductor power transistor and a memory area including a plurality of nonvolatile memory elements, the method comprising the steps of:

forming a mask on said memory area; and irradiating through said mask with electron beams to simultaneously a) adjust lifetimes of high-voltage regions of the semiconductor device and b) record data in one or more nonvolatile memory elements, said mask having transmission parts on one or more nonvolatile memory elements selected from said plurality of nonvolatile memory elements and a blocking part in which the electron beam is blocked so that said one or more nonvolatile memory elements are irradiated with electron beams.

2. The manufacturing method according to claim 1;

wherein said semiconductor device has an another element which is not need to be irradiated with electron beams and said mask is formed so that said blocking part covers said another element.

* * * * *